United States Patent [19]

McDougall et al.

[11] Patent Number: 5,680,044
[45] Date of Patent: Oct. 21, 1997

[54] OSCILLATING MAGNETIC FIELD GENERATING ASSEMBLY

[75] Inventors: Ian Leitch McDougall, Chalbury; Peter Hanley, Forest of Dean, both of United Kingdom

[73] Assignee: Oxford Instruments PLC, Oxford, United Kingdom

[21] Appl. No.: 428,245

[22] PCT Filed: Nov. 18, 1993

[86] PCT No.: PCT/GB93/02370

§ 371 Date: Jun. 30, 1995

§ 102(e) Date: Jun. 30, 1995

[87] PCT Pub. No.: WO94/11748

PCT Pub. Date: May 26, 1994

[30] Foreign Application Priority Data

Nov. 18, 1992 [GB] United Kingdom .................... 9224168
Aug. 13, 1993 [GB] United Kingdom .................... 9316894

[51] Int. Cl.$^6$ .......................................................... G01V 3/00
[52] U.S. Cl. ............................................. 324/303; 324/318
[58] Field of Search .................................... 324/300, 303, 324/307, 309, 318; 335/299, 296

[56] References Cited

U.S. PATENT DOCUMENTS

| | | | |
|---|---|---|---|
| 3,238,446 | 3/1966 | Zimmerman | 324/303 |
| 4,350,955 | 9/1982 | Jackson et al. | 324/303 |
| 4,707,662 | 11/1987 | Kemner | 324/318 |
| 4,714,881 | 12/1987 | Givins | 324/303 |
| 4,725,779 | 2/1988 | Hyde | 324/318 |
| 4,739,271 | 4/1988 | Haase | 324/318 |
| 4,764,726 | 8/1988 | Misic et al. | 324/322 |
| 4,816,766 | 3/1989 | Zabel | 324/318 |
| 4,817,612 | 4/1989 | Akins et al. | 324/318 |
| 5,150,052 | 9/1992 | Meyerand | 324/309 |
| 5,270,656 | 12/1993 | Roberts et al. | 324/322 |
| 5,278,505 | 1/1994 | Arakawa | 324/322 |
| 5,332,967 | 7/1994 | Shporer | 324/303 |
| 5,349,298 | 9/1994 | Nakabayashi | 324/322 |

FOREIGN PATENT DOCUMENTS

| | | |
|---|---|---|
| 0 352 824 | 1/1990 | European Pat. Off. . |
| A 399 789 | 11/1990 | European Pat. Off. . |
| WO 92/07279 | 4/1992 | WIPO . |

OTHER PUBLICATIONS

M. Robin Bendall, et al. "Elimination of Coupling between Cylindrical Transmit Coils and Surface–Receive Coils for in Vivo NMR," *Magnetic Resonance in Medicine* 3, pp. 157–163 (1986), Feb., nr. 1, New York, USA.

Radiology, vol. 160, No. 3, *Rotator Cuff Tears: Preliminary Application of High–Resolution MR Imaging with Counter Rotating Current Loop–Gap Resonators*, J. Kneeland, MD, G. Carrera, MD, W. Middleton, MD, N. Campagna, MS, L. Ryan, MD, A. Jesmanowicz, PhD, W. Froncisz, PhD, J. Hyde, PhD, Sep. 1986, all pages.

Journal of Magnetic Resonance, No. 3, *Novel NMR Apparatus for Investigating an External Sample*, R.L. Kleinberg, A. Sezginer, D.D. Griffin, M. Fukuhara, May 1992, all pages.

*Primary Examiner*—Louis M. Arana
*Attorney, Agent, or Firm*—Staas & Halsey

[57] ABSTRACT

A nuclear magnetic resonance apparatus having a magnetic assembly which generates a main static field in a working region which is external of the magnetic assembly. The main static magnetic field has a uniformity suitable for performing NMR experiments. An oscillating magnetic field generating assembly is provided with a set of axially aligned electrical coils connected to an oscillating electrical source. The axially aligned electrical coils generate an rf magnetic filed within the working region of the magnet assembly. Adjacent coils of the axially aligned electrical coils are wound in opposite senses and connected in series so as to generate opposing magnetic fields which superimpose to produce an oscillating magnetic field external of the magnet assembly. The oscillating magnetic field is sufficiently uniform within the working region to perform NMR experiments.

11 Claims, 3 Drawing Sheets

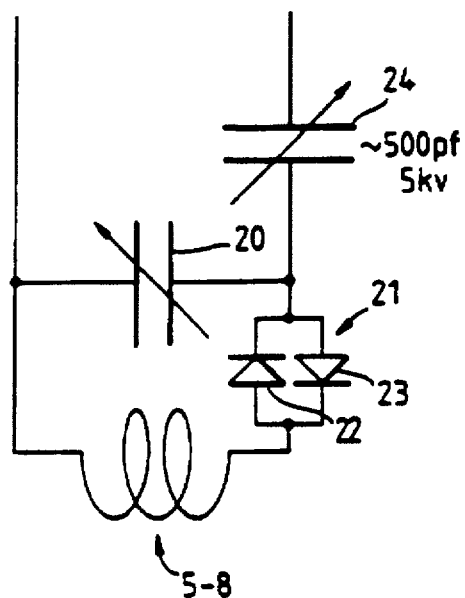
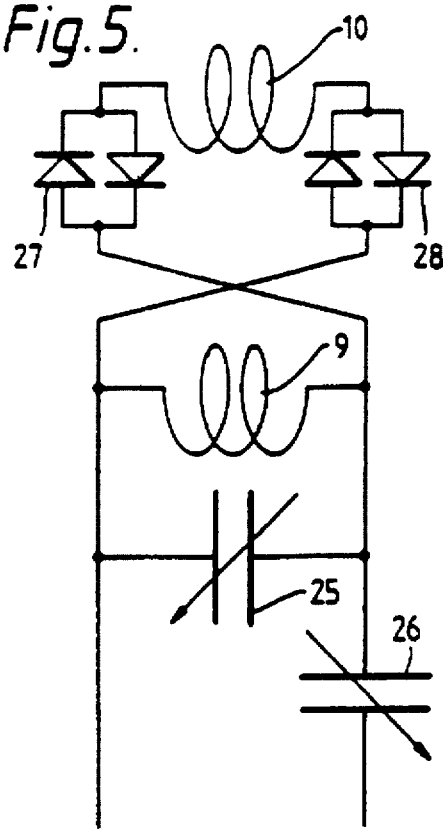
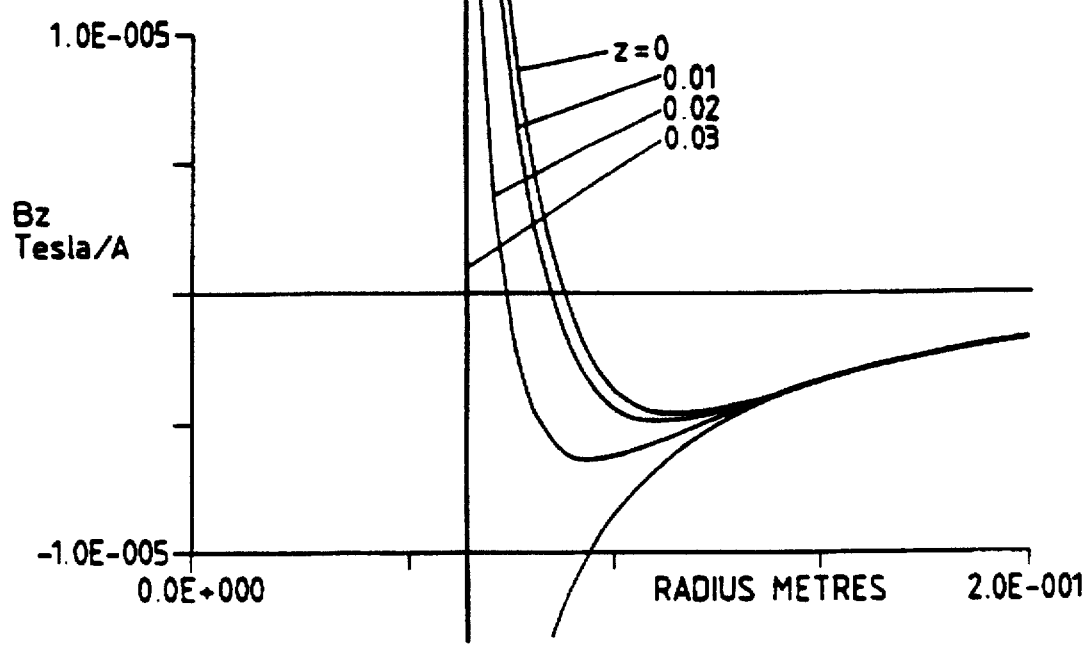

OSCILLATING MAGNETIC FIELD GENERATING ASSEMBLY

BACKGROUND OF THE INVENTION

1. Field of the Invention

The invention relates to an oscillating magnetic field generating assembly for use with a magnet assembly which generates a magnetic field in a working region externally of the magnet assembly having a uniformity suitable for performing an NMR experiment.

2. Related Art

Magnet assemblies have been developed in recent years for inspecting bore holes for oil bearing rock. A typical example of such an assembly is described in U.S. Pat. No. 4,350,955 in which a pair of permanent magnets are provided spaced apart with their north-south axes aligned and with like poles facing one another. This arrangement has the advantage that the oscillating magnetic field generating assembly which has to be provided can be in the form of a RF coil positioned in the space between the magnets. More recently, a modified form of this arrangement has been described in WO92/07279.

One of the problems with these arrangements which has been discovered in use that there is a significant variation in the magnetic field generated by the oscillating magnetic field generating assembly (conventionally known as the $B_1$-field) over the working region. This becomes particularly significant when the radial extent of the working region is increased. This has two effects on the NMR measurement.

The first effect is the non-uniform excitation of the spins. This means that in a typical spin-echo measurement 90°, 180° etc pulses are not defined, and so optimum excitation cannot be obtained over the whole volume. This both reduces the signal strength and confuses the interpretation.

The second effect is that the signal which is received by the RF coil is weighted in favour of the nearer parts of the sensitive volume. This again confuses the interpretation of the data.

Both of these untoward effects can in principle be overcome by complex pulse sequences, but these are difficult to design and implement and may restrict the range of measurements which can be made.

In accordance with one aspect of the present invention, an oscillating magnetic field generating assembly for use with a magnet assembly which generates a magnetic field in a working region externally of the magnet assembly having a uniformity suitable for performing an NMR experiment, comprises a set of electrical coils connected to an oscillating electrical source, the coils being arranged such that the magnetic field generated by the oscillating magnetic field assembly is also sufficiently uniform within the working region to perform an NMR experiment.

The inventors have for the first time considered the oscillating magnetic field generating assembly in terms of the magnetic field which it generates and have realised that the problems set out above can be overcome by designing the assembly such that the magnetic field which it generates within the working region is sufficiently uniform to perform an NMR experiment.

The degree of uniformity required of the field generated by the oscillating magnetic field generating assembly is much less than that normally required of the magnet assembly. Typically, an oscillating magnetic field having uniformity of the order of 25% across the working region is acceptable whereas the uniformity required of the main magnetic field generated by the magnet assembly is usually parts per million, for example 100 parts per million or better.

Conveniently, the set of electrical coils is arranged such that at least the first order variation of magnetic field with distance is substantially zero. This is most easily arranged if the coils are substantially coaxial and, where a set of four electrical coils are provided, where the axially inner coils are each positioned about a mid-point between the axially outer coils at a distance from the mid-point substantially equal to the radius of the axially outer coils.

In some circumstances, a problem can arise with this geometry, particularly using spaced apart electrical coils, namely that the coils can detect noise signals. Preferably, therefore, the electrical coils are connected in a resonant circuit which includes a current control device which prevents flow of current in the resonant circuit unless the potential difference across the current control device exceeds a threshold.

This effectively decouples the oscillating magnetic field generating assembly from receiving noise signals.

The invention is applicable in a wide variety of fields including magnetic resonance imaging of the human or animal body but is particularly suited for use in downhole applications. In this case, however, there is limited space and the normal arrangement of conventional MRI in which separate transmitter and receiver coils are provided is not possible. It has therefore been the practice to utilise the same coil for both transmitting and receiving signals. However, this leads to poor signal-to-noise ratios.

In accordance with a second aspect of the present invention, a magnetic field detection assembly comprises a first electrical coil electrically connected in a resonant circuit; and a second electrical coil, similar to the first electrical coil, connected in parallel and in an opposite sense to the first electrical coil via current control means which only permit current flow through the second electrical coil when the potential difference across the current control means exceeds a threshold.

In this aspect of the invention, we provide a detection assembly which includes a first coil for sensing a magnetic field and a second coil connected in parallel but in an opposite sense and through which current can flow only when the potential difference exceeds a threshold so as to cancel the receipt of large signals but which accurately picks up the desired small signals. The advantage of this arrangement is that it allows the use of a detection assembly separate from an oscillating magnetic field generating assembly within a confined spaced and achieves good signal to noise ratio results.

Typically, the turns of the first and second coils are interleaved and preferably the first and second coils are substantially coaxial.

In accordance with a third aspect of the present invention, nuclear magnetic resonance apparatus comprises a magnet assembly which generates a magnetic field in a working region externally of the magnet assembly having a uniformity suitable for performing an NMR experiment; an oscillating magnetic field generating assembly for generating an oscillating magnetic field in the working region having sufficient uniformity to perform a NMR experiment; and a magnetic field detection assembly separate from the generating assembly for detecting an oscillating magnetic field originating in the working region.

Preferably, the oscillating magnetic field generating assembly is constructed in accordance with the first aspect of the invention and the magnetic field detection assembly is constructed in accordance with the second aspect of the invention.

BRIEF DESCRIPTION OF THE DRAWINGS

Some examples of nuclear magnetic resonance apparatus incorporating assemblies according to the invention will now be described with reference to the accompanying drawings, in which:

FIG. 3 is a circuit diagram of a transmitter resonant circuit in accordance with a preferred embodiment of the present invention;

FIG. 4 is a graph which illustrates a variation of field with radius at different axial (2) positions of transmitter coil in accordance with a preferred embodiment of the present invention;

FIG. 5 is a circuit diagram of a receiver coil resonant circuit in accordance with a preferred embodiment of the present invention;

DESCRIPTION OF THE PREFERRED EMBODIMENTS

Figure 1:
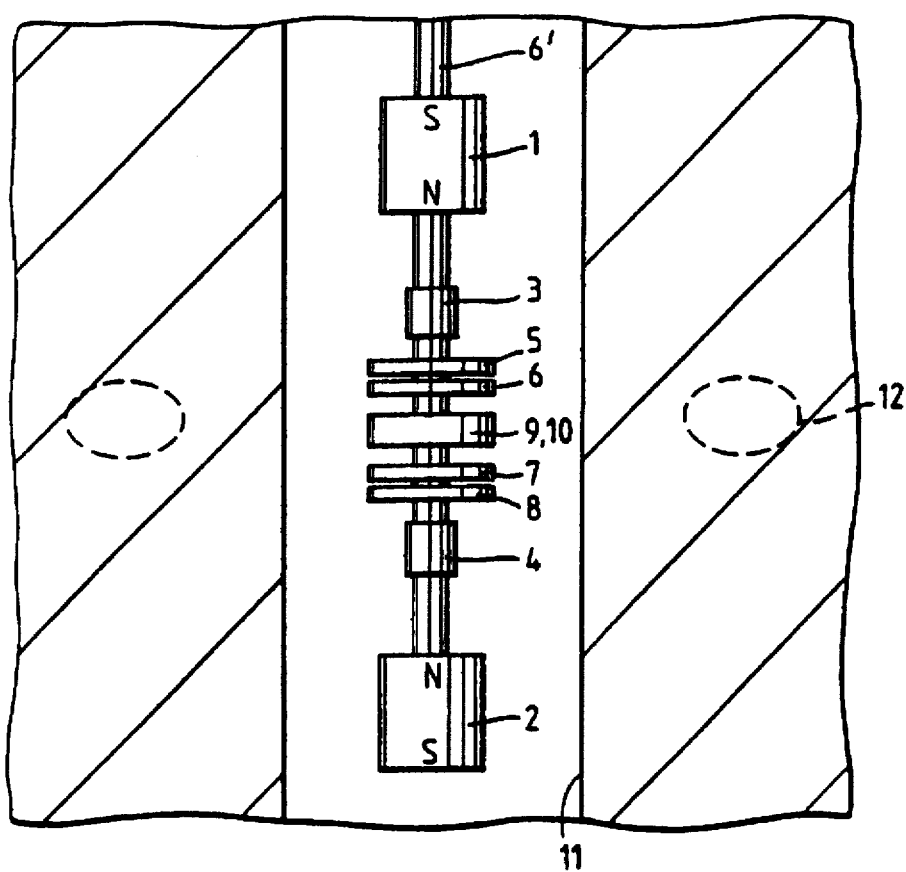
FIG. 1 is a schematic block diagram of an apparatus inserted in a bore hole in accordance with a preferred embodiment of the present invention.

Reference will now be made in detail to the present preferred embodiments of the present invention, examples of which are illustrated in the accompanying drawings, wherein like reference numerals refer to like elements throughout.

The apparatus shown in FIG. 1 is based on that described in WO92/07279 and will only be briefly described here. A pair of main, first magnets 1, 2 are positioned coaxially with their north poles facing one another. The magnets 1, 2 are mounted by means not shown to a support 6'. Axially inwardly of the magnets 1, 2 are mounted a pair of second, auxiliary magnets 3, 4 with their north to south axes coaxial with the axis defined by the magnets 1, 2. The direction and magnetisation strength of the magnets 3, 4 is selected from a knowledge of how the different gradients vary. The magnets 1–4 are generally symmetrically positioned about a mid-plane orthogonal to the axis. Four RF transmitter coils 5–8 are positioned coaxial with the central axis in the space between the magnets 3, 4 and a pair of receiver coils 9, 10 are centrally positioned between the transmitter coils 6, 7 coaxial with the central axis.

In use, the support 6' is coupled to a mechanism (not shown) which drops the assembly down through a bore hole 11. The magnets 1–4 are positioned and have field strengths such that a toroidal working volume 12 is generated within the rock strata surrounding the bore hole 11, the magnetic field within the working volume 12 being sufficiently uniform to perform an NMR experiment. This is described in more detail in WO92/07279 incorporated herein by reference.

Once the assembly has been correctly located, the transmitter coils 5–8 are suitably actuated to excite the nuclear spins within the working volume and as the spins relax and generate corresponding signals, these are received by the receiver coils 9, 10 and fed to suitable detection circuitry (not shown) but which is of a conventional form.

As is explained above, the transmitter coils are designed such that they generate a substantially uniform magnetic field within the working region 12. This is achieved using the four coils 5–8 which in one configuration are arranged as set out in Table 1 below. In this Table, conventional notation is used with all dimensions in meters. $a_1$, $a_2$ are inner and outer radii, and $b_1$, $b_2$ are axial displacements about a local origin at the centre of the coil. Z defines the position of the local origin relative to the centre of the assembly. Current is in amps.

TABLE 1

| Coil 5 | | |
|---|---|---|
| Current | 6.667E + 004 | Z = 5.400E − 002 |
| a1 | 5.600E − 02 | |
| a2 | 6.000E − 002 | |
| b1 | −7.500E − 003 | |
| b2 | 7.500E − 003 | |
| accuracy | 20 | |
| Coil 6 | | |
| Current | 6.667E + 004 | Z = 3.800E − 002 |
| a1 | 5.600E − 002 | |
| a2 | 6.000E − 002 | |
| b1 | −7.500E − 003 | |
| b2 | 7.500E − 003 | |
| accuracy | 20 | |
| Coil 7 | | |
| Current | 6.667E + 004 | Z = −3.800E − 002 |
| a1 | 5.600E − 002 | |
| a2 | 6.000E − 002 | |
| b1 | −7.500E − 003 | |
| b2 | 7.500E − 003 | |
| accuracy | 20 | |
| Coil 8 | | |
| Current | 6.667E + 004 | Z = −5.400E − 002 |
| a1 | 5.600E − 002 | |
| a2 | 6.000E − 002 | |
| b1 | −7.500E − 003 | |
| b2 | 7.500E − 003 | |
| accuracy | 20 | |

The current for 3 Gauss at R = 125 mm is 67A

Figure 2A:
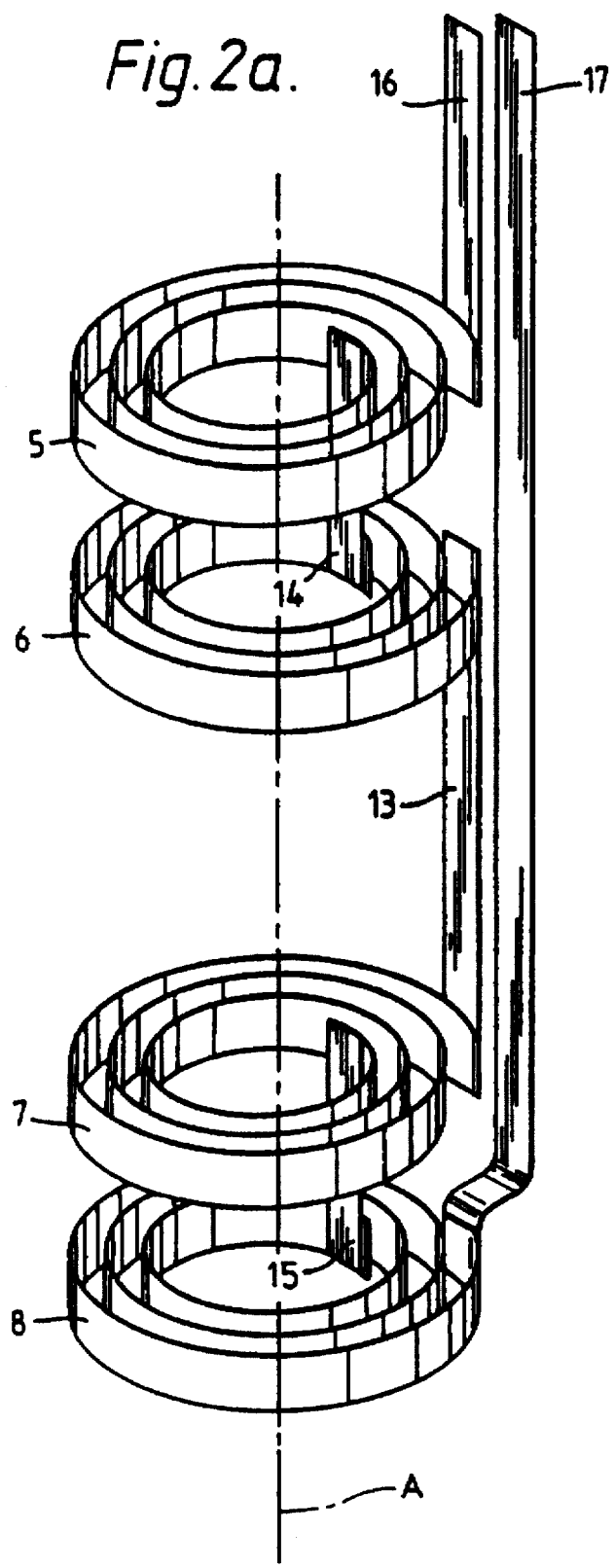
FIG. 2A is a diagram of a transmitter coil detail in accordance with a preferred embodiment of the present invention.
Figure 2B:
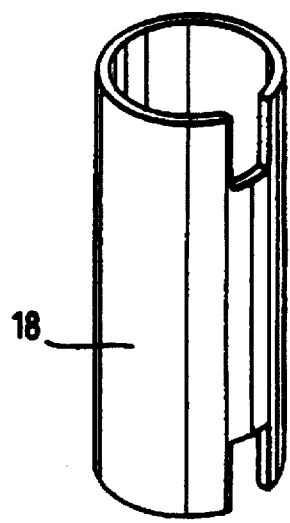
FIG. 2B is a diagram of a former for transmitter coils in accordance with a preferred embodiment of the present invention.

As can be seen in FIG. 2A, the transmitter coils 5–8 are arranged in two double-pancakes about an axis H, each of four turns (although only three turns in each case is shown in the drawing). The members of each pair 5, 6; 7,8 are wound in opposite senses and connected to each other at their inner radius. The inner coils 6,7 are connected together by a connector 13 and the pairs of coils 5, 6; 7, 8 are connected together by respective connectors 14, 15. The coil 5 and the coil 8 are connected to remote current control electronics (not shown) via connectors 16, 17. The coils 5–8 are mounted on a former 18 (FIG. 2B). The coils are wound from copper tape, 15 mm wide×0.5 mm thick with 0.5 mm inter-turn spacing. Annular disc-shaped spacers of PTFE (not shown) are positioned between the coils 5, 6 and the coils 7, 8 respectively to space them apart by about 1 mm. Interconnections 13, 14, 15 can be of similar tape, silver soldered, with 0.5 mm PTFE or Kapton insulation to withstand the 5 kV terminal-to-terminal voltage.

FIG. 3 illustrates the electrical, resonant circuit including the transmitter coils 5-8. As can be seen, the transmitter coils are connected in series with a variable capacitor 20 and a control device 21 consisting of a pair of 60A Schottky barrier diodes 22, 23 connected in parallel and in opposite senses.

The characteristic of the control device 21 is such that current will only flow in the resonant circuit if the voltage across the control device 21 exceeds about 0.5 volts. This prevents noise signals being detected by the transmitter coils. The resonant circuit is connected to a conventional rf source, (not shown) via a matching capacitor 24.

The coil assembly set out in Table 1 has been modelled and it has been found that the Z-component of field is uniform to 25% from 100 mm to 150 mm radially, and within ±20 mm vertically. The inductance is 21.1 µH leading to a tuning capacitance of about 4.5 nF and a peak voltage of 4.5 kV. The coupling with the surroundings (inner radius 75 mm, conductivity 8.7 $Sm^{-1}$) is 1.57 ohms. The construction described above should ensure that the resistance of the coil itself is much less than this. The corresponding power dissipation is 5 kW rms, requiring a 10:1 duty cycle. Where the conductivity is 3 $Sm^{-1}$ and higher conductivity fluid is excluded then a 4:1 duty cycle should be attainable for 500 W average power, ignoring other loss mechanisms.

The field variation with radius shown in FIG. 4 has been obtained using the data shown in Table 2 below using conventional notation. Z (meters) is axial position relative to the centre of the assembly (FIG. 1), R (meters) is radial distance from origin and Q (degrees) is the angular offset in the radial plane from an origin direction.

TABLE 2

FIELD PLOTS

| R | Tesla<br>Br | Meters<br>BΘ | Degrees<br>Bz | Bmod |
|---|---|---|---|---|
| Θ = 0.000E + 000 | | | | |
| Z = 0.000E + 000 | | | | |
| 0.000E + 000 | 0.000E + 000 | 0.000E + 000 | 8.502E − 005 | 8.502E − 005 |
| 5.000E − 003 | −1.332E − 021 | 0.000E + 000 | 8.479E − 005 | 8.479E − 005 |
| 1.000E − 002 | −4.441E − 022 | 0.000E + 000 | 8.410E − 005 | 8.410E − 005 |
| 1.500E − 002 | −1.776E − 021 | 0.000E + 000 | 8.287E − 005 | 8.287E − 005 |
| 2.000E − 002 | −8.882E − 022 | 0.000E + 000 | 8.102E − 065 | 8.102E − 005 |
| 2.500E − 002 | −4.441E − 021 | 0.000E + 000 | 7.840E − 005 | 7.840E − 005 |
| 3.000E − 002 | −1.716E − 021 | 0.000E + 000 | 7.484E − 005 | 7.484E − 005 |
| 3.500E − 002 | −8.882E − 022 | 0.000E + 000 | 7.018E − 005 | 7.018E − 005 |
| 4.000E − 002 | −4.337E − 025 | 0.000E + 000 | 6.425E − 005 | 6.425E − 005 |
| 4.500E − 002 | 0.000E + 000 | 0.000E + 000 | 5.703E − 005 | 5.703E − 005 |
| 5.000E − 002 | 0.000E + 000 | 0.000E + 000 | 4.866E − 005 | 4.866E − 005 |
| 5.500E − 002 | 0.000E + 000 | 0.000E + 000 | 3.957E − 005 | 3.957E − 005 |
| 6.000E − 002 | 0.000E + 000 | 0.000E + 000 | 4.283E − 005 | 4.283E − 005 |
| 6.500E − 002 | 0.000E + 000 | 0.000E + 000 | 2.189E − 005 | 2.189E − 005 |
| 7.000E − 002 | −1.776E − 021 | 0.000E + 000 | 1.456E − 005 | 1.456E − 005 |
| 7.500E − 002 | 0.000E + 000 | 0.000E + 000 | 8.663E − 006 | 8.663E − 006 |
| 8.000E − 002 | −1.776E − 021 | 0.000E + 000 | 4.193E − 006 | 4.193E − 006 |
| 8.500E − 002 | −8.882E − 022 | 0.000E + 000 | 9.633E − 007 | 9.633E − 007 |
| 8.000E − 002 | −8.882E − 022 | 0.000E + 000 | −1.272E − 006 | 1.272E − 006 |
| 9.500E − 002 | 8.882E − 022 | 0.000E + 000 | −2.751E − 006 | 2.751E − 006 |
| 1.000E − 001 | 8.882E − 022 | 0.000E + 000 | −3.679E − 006 | 3.679E − 006 |
| 1.050E − 001 | 4.443E − 022 | 0.000E + 000 | −4.214E − 006 | 4.214E − 006 |
| 1.100E − 001 | −4.441E − 022 | 0.000E + 000 | −4.477E − 006 | 4.477E − 006 |
| 1.150E − 001 | 0.000E + 000 | 0.000E + 000 | −4.554E − 006 | 4.554E − 006 |
| 1.200E − 001 | 0.000E + 000 | 0.000E + 000 | −4.507E − 006 | 4.507E − 006 |
| 2.250E − 001 | 4.441E − 022 | 0.000E + 000 | −4.382E − 006 | 4.382E − 006 |
| 1.300E − 001 | 1.084E − 025 | 0.000E + 000 | −4.208E − 006 | 4.208E − 006 |
| 1.350E − 001 | 0.000E + 000 | 0.000E + 000 | −4.006E − 006 | 4.006E − 006 |
| 1.400E − 001 | 2.220E − 022 | 0.000E + 000 | −3.791E − 006 | 3.791E − 006 |
| 1.450E − 001 | 2.220E − 022 | 0.000E + 000 | −3.573E − 006 | 3.573E − 006 |
| 1.500E − 001 | 0.000E + 000 | 0.000E + 000 | −3.357E − 006 | 3.357E − 006 |
| 1.550E − 001 | 0.000E + 000 | 0.000E + 000 | −3.149E − 006 | 3.149E − 006 |
| 1.600E − 001 | 5.421E − 026 | 0.000E + 000 | −2.950E − 006 | 2.950E − 006 |
| 1.650E − 001 | −1.110E − 022 | 0.000E + 000 | −2.761E − 006 | 2.761E − 006 |
| 1.700E − 001 | −5.421E − 026 | 0.000E + 000 | −2.584E − 006 | 2.584E − 006 |
| 1.750E − 001 | 0.000E + 000 | 0.000E + 000 | −2.418E − 006 | 2.418E − 006 |
| 1.800E − 001 | −1.110E − 022 | 0.000E + 000 | −2.263E − 006 | 2.263E − 006 |
| 1.850E − 001 | 1.110E − 022 | 0.000E + 000 | −2.119E − 006 | 2.119E − 006 |
| 1.900E − 001 | −1.110E − 022 | 0.000E + 000 | −1.986E − 006 | 1.986E − 006 |
| 1.950E − 001 | 5.554E − 023 | 0.000E + 000 | −1.862E − 006 | 1.862E − 006 |
| 2.000E − 001 | −5.551E − 023 | 0.000E + 000 | −1.747E − 006 | 1.747E − 006 |
| Z = 1.000E − 002 | | | | |
| 0.000E + 000 | 0.000E + 000 | 0.000E + 000 | 8.674E − 005 | 8.674E − 005 |
| 5.000E − 003 | 8.402E − 007 | 0.000E + 000 | 8.657E − 005 | 8.657E − 005 |
| 1.000E − 002 | 1.757E − 006 | 0.000E + 000 | 8.603E − 005 | 8.605E − 005 |
| 1.500E − 002 | 2.830E − 006 | 0.000E + 000 | 8.507E − 005 | 8.511E − 005 |
| 2.000E − 002 | 4.143E − 006 | 0.000E + 000 | 8.358E − 005 | 8.368E − 005 |

TABLE 2-continued

FIELD PLOTS

| R | Tesla<br>Br | Meters<br>BΘ | Degrees<br>Bz | Bmod |
|---|---|---|---|---|
| 2.500E − 002 | 5.779E − 006 | 0.000E + 000 | 8.143E − 005 | 8.164E − 005 |
| 3.000E − 002 | 7.810E − 006 | 0.000E + 000 | 7.841E − 005 | 7.880E − 005 |
| 3.500E − 002 | 1.027E − 005 | 0.000E + 000 | 7.427E − 005 | 7.497E − 005 |
| 4.000E − 002 | 1.308E − 005 | 0.000E + 000 | 6.867E − 005 | 6.991E − 005 |
| 4.500E − 002 | 1.599E − 005 | 0.000E + 000 | 6.135E − 005 | 6.339E − 005 |
| 5.000E − 002 | 1.843E − 005 | 0.000E + 000 | 5.218E − 005 | 5.534E − 005 |
| 5.500E − 002 | 1.964E − 005 | 0.000E + 000 | 4.155E − 005 | 4.596E − 005 |
| 6.000E − 002 | 1.904E − 005 | 0.000E + 000 | 4.473E − 005 | 4.861E − 005 |
| 6.500E − 002 | 1.676E − 005 | 0.000z + 000 | 2.050E − 005 | 2.648E − 005 |
| 7.000E − 002 | 1.356E − 005 | 0.000E + 000 | 1.238E − 005 | 1.836E − 005 |
| 7.500E − 002 | 1.028E − 005 | 0.000E + 000 | 6.346E − 006 | 1.208E − 005 |
| 8.000E − 002 | 7.405E − 006 | 0.000E + 000 | 2.123E − 006 | 7.703E − 006 |
| 8.500E − 002 | 5.119E − 006 | 0.000E + 000 | −7.189E − 007 | 5.169E − 006 |
| 9.000E − 002 | 3.397E − 006 | 0.000E + 000 | −2.563E − 006 | 4.256E − 006 |
| 9.500E − 002 | 2.147E − 006 | 0.000E + 000 | −3.707E − 006 | 4.284E − 006 |
| 1.000E − 001 | 1.262E − 006 | 0.000E + 000 | −4.369E − 006 | 4.548E − 006 |
| 1.050E − 001 | 6.480E − 007 | 0.000E + 000 | −4.703E − 006 | 4.748E − 006 |
| 1.100E − 001 | 2.303E − 007 | 0.000E + 000 | −4.818E − 006 | 4.823E − 006 |
| 1.150E − 001 | −4.760E − 008 | 0.000E + 000 | −4.788E − 006 | 4.788E − 006 |
| 1.200E − 001 | −2.273E − 007 | 0.000E + 000 | −4.665E − 006 | 4.670E − 006 |
| 1.250E − 001 | −3.387E − 007 | 0.000E + 000 | −4.485E − 006 | 4.498E − 006 |
| 1.300E − 001 | −4.031E − 007 | 0.000E + 000 | −4.273E − 006 | 4.292E − 006 |
| 1.350E − 001 | −4.353E − 007 | 0.000E + 000 | −4.044E − 006 | 4.068E − 006 |
| 1.400E − 001 | −4.459E − 007 | 0.000E + 000 | −3.811E − 006 | 3.837E − 006 |
| 1.450E − 001 | −4.423E − 007 | 0.000E + 000 | −3.580E − 006 | 3.608E − 006 |
| 1.500E − 001 | −4.296E − 007 | 0.000E + 000 | −3.357E − 006 | 3.384E − 006 |
| 1.550E − 001 | −4.113E − 007 | 0.000E + 000 | −3.143E − 006 | 3.169E − 006 |
| 1.600E − 001 | −3.899E − 007 | 0.000E + 000 | −2.940E − 006 | 2.966E − 006 |
| 1.650E − 001 | −3.669E − 007 | 0.000E + 000 | −2.749E − 006 | 2.774E − 006 |
| 1.700E − 001 | −3.436E − 007 | 0.000E + 000 | −2.571E − 006 | 2.594E − 006 |
| 1.750E − 001 | −3.205E − 007 | 0.000E + 000 | −2.405E − 006 | 2.426E − 006 |
| 1.800E − 001 | −2.983E − 007 | 0.000E + 000 | −2.250E − 006 | 2.270E − 006 |
| 1.850E − 001 | −2.771E − 007 | 0.000E + 000 | −2.106E − 006 | 2.125E − 006 |
| 1.900E − 001 | −2.571E − 007 | 0.000E + 000 | −1.973E − 006 | 1.990E − 006 |
| 1.950E − 001 | −2.384E − 007 | 0.000E + 000 | −1.850E − 006 | 2.865E − 006 |
| 2.000E − 001 | −2.210E − 007 | 0.000E + 000 | −1.736E − 006 | 1.750E − 006 |
| Z = 2.000E − 002 | | | | |
| 0.000E + 000 | 0.000E + 000 | 0.000E + 000 | 9.111E − 005 | 9.111E − 005 |
| 5.000E − 003 | 1.280E − 006 | 0.000E + 000 | 9.108E − 005 | 9.109E − 005 |
| 1.000E − 002 | 2.696E − 006 | 0.000E + 000 | 9.098E − 005 | 9.102E − 005 |
| 1.500E − 002 | 4.399E − 006 | 0.000E + 000 | 9.078E − 005 | 9.088E − 005 |
| 2.000E − 002 | 6.557E − 006 | 0.000E + 000 | 9.041E − 005 | 9.065E − 005 |
| 2.500E − 002 | 9.378E − 006 | 0.000E + 000 | 8.977E − 005 | 9.025E − 005 |
| 3.000E − 002 | 1.311E − 005 | 0.000E + 000 | 8.866E − 005 | 8.962E − 005 |
| 3.500E − 002 | 1.805E − 005 | 0.000E + 000 | 8.674E − 005 | 8.860E − 005 |
| 4.000E − 002 | 2.451E − 005 | 0.000E + 000 | 8.341E − 005 | 8.693E − 005 |
| 4.500E − 002 | 3.262E − 005 | 0.000E + 000 | 7.752E − 005 | 8.410E − 005 |
| 5.000E − 002 | 4.170E − 005 | 0.000E + 000 | 6.715E − 005 | 7.905E − 005 |
| 5.500E − 002 | 4.853E − 005 | 0.000E + 000 | 5.033E − 005 | 6.992E − 005 |
| 6.000E − 002 | 4.749E − 005 | 0.000E + 000 | 5.126E − 005 | 6.988E − 005 |
| 6.500E − 002 | 3.861E − 005 | 0.000E + 000 | 1.280E − 005 | 4.068E − 005 |
| 7.000E − 002 | 2.807E − 005 | 0.000E + 000 | 2.989E − 006 | 2.823E − 005 |
| 7.500E − 002 | 1.935E − 005 | 0.000E + 000 | −2.064E − 006 | 2.946E − 005 |
| 8.000E − 002 | 1.293E − 005 | 0.000E + 000 | −4.570E − 006 | 1.372E − 005 |
| 8.500E − 002 | 8.397E − 006 | 0.000E + 000 | −5.752E − 006 | 1.018E − 005 |
| 9.000E − 002 | 5.248E − 006 | 0.000E + 000 | −6.232E − 006 | 8.148E − 006 |
| 9.500E − 002 | 3.087E − 006 | 0.000E + 000 | −6.330E − 006 | 7.043E − 006 |
| 1.000E − 001 | 1.619E − 006 | 0.000E + 000 | −6.218E − 006 | 6.425E − 006 |
| 1.050E − 001 | 6.340E − 007 | 0.000E + 000 | −5.990E − 006 | 6.023E − 006 |
| 1.100B − 001 | −1.628E − 008 | 0.000E + 000 | −5.702E − 006 | 5.702E − 006 |
| 1.150E − 001 | −4.352E − 007 | 0.000E + 000 | −5.386E − 006 | 5.403E − 006 |
| 1.200E − 001 | −6.952E − 007 | 0.000E + 000 | −5.061E − 006 | 5.108E − 006 |
| 1.250E − 001 | −8.464E − 007 | 0.000E + 000 | −4.739E − 006 | 4.814E − 006 |
| 1.300E − 001 | −9.239E − 007 | 0.000E + 000 | −4.428E − 006 | 4.524E − 006 |
| 1.350E − 001 | −9.521E − 007 | 0.000E + 000 | −4.132E − 006 | 4.240E − 006 |
| 1.400E − 001 | −9.476E − 007 | 0.000E + 000 | −3.852E − 006 | 3.967E − 006 |
| 1.450E − 001 | −9.223E − 007 | 0.000E + D00 | −3.589E − 006 | 3.706E − 006 |
| 1.500E − 001 | −8.841E − 007 | 0.000E + 000 | −3.344E − 006 | 3.459E − 006 |
| 1.550E − 001 | −8.386E − 007 | 0.000E + 000 | −3.116E − 006 | 3.227E − 006 |
| 1.600E − 001 | −7.894E − 007 | 0.000E + 000 | −2.905E − 006 | 3.011E − 006 |
| 1.650E − 001 | −7.391E − 007 | 0.000E + 000 | −2.710E − 006 | 2.809E − 006 |
| 1.700E − 001 | −6.894E − 007 | 0.000E + 000 | −2.529E − 006 | 2.622E − 006 |
| 1.750E − 001 | −6.413E − 007 | 0.000E + 000 | −2.363E − 006 | 2.448E − 006 |

TABLE 2-continued

FIELD PLOTS

| R | Tesla Br | Meters BΘ | Degrees Bz | Bmod |
|---|---|---|---|---|
| 1.800E − 001 | −5.955E − 007 | 0.000E + 000 | −2.209E − 006 | 2.288E − 006 |
| 1.850E − 001 | −5.522E − 007 | 0.000E + 000 | −2.066E − 006 | 2.139E − 006 |
| 1.900E − 001 | −5.117E − 007 | 0.000E + 000 | −1.935E − 006 | 2.002E − 006 |
| 1.950E − 001 | −4.740E − 007 | 0.000E + 000 | −1.814E − 006 | 1.875E − 006 |
| 2.000E − 001 | −4.390E − 007 | 0.000E + 000 | −1.702E − 006 | 1.757E − 006 |
| Z = 3.000E − 002 | | | | |
| 0.000E + 000 | 0.000E + 000 | 0.000E + 000 | 9.586E − 005 | 9.586E − 005 |
| 5.000E − 003 | 1.017E − 006 | 0.000E + 000 | 9.603E − 005 | 9.603E − 005 |
| 1.000E − 002 | 2.179E − 006 | 0.000E + 000 | 9.652E − 005 | 9.655E − 005 |
| 1.500E − 002 | 3.648E − 006 | 0.000E + 000 | 9.738E − 005 | 9.744E − 005 |
| 2.000E − 002 | 5.625E − 006 | 0.000E + 000 | 9.862E − 005 | 9.878E − 005 |
| 2.500E − 002 | 8.378E − 006 | 0.000E + 000 | 1.003E − 004 | 1.007E − 004 |
| 3.000E − 002 | 1.229E − 005 | 0.000E + 000 | 1.025E − 004 | 1.032E − 004 |
| 3.500E − 002 | 1.794E − 005 | 0.000E + 000 | 1.053E − 004 | 1.068E − 004 |
| 4.000E − 002 | 2.630E − 005 | 0.000E + 000 | 1.086E − 004 | 1.118E − 004 |
| 4.500E − 002 | 3.922E − 005 | 0.000E + 000 | 1.125E − 004 | 1.192E − 004 |
| 5.000E − 002 | 6.121E − 005 | 0.000E + 000 | 1.165E − 004 | 1.316E − 004 |
| 5.500E − 002 | 1.124E − 004 | 0.000E + 000 | 1.154E − 004 | 1.611E − 004 |
| 6.000E − 002 | 1.321E − 004 | 0.000E + 000 | 4.178E − 005 | 1.385E − 004 |
| 6.500E − 002 | 6.003E − 005 | 0.000E + 000 | −2.507E − 005 | 6.505E − 005 |
| 7.000E − 002 | 3.445E − 005 | 0.000E + 000 | −2.163E − 005 | 4.068E − 005 |
| 7.500E − 002 | 2.068E − 005 | 0.000E + 000 | −1.822E − 005 | 2.757E − 005 |
| 8.000E − 002 | 1.242E − 005 | 0.000E + 000 | −1.536E − 005 | 1.976E − 005 |
| 8.500E − 002 | 7.237E − 006 | 0.000E + 000 | −1.304E − 005 | 1.491E − 005 |
| 9.000E − 002 | 3.909E − 006 | 0.000E + 000 | −1.119E − 005 | 1.185E − 005 |
| 9.500E − 002 | 1.759E − 006 | 0.000E + 000 | −9.705E − 006 | 9.864E − 006 |
| 1.000E − 001 | 3.736E − 007 | 0.000E + 000 | −8.512E − 006 | 8.520E − 006 |
| 1.050E − 002 | −5.084E − 007 | 0.000E + 000 | −7.539E − 006 | 7.556E − 006 |
| 1.100E − 001 | −1.055E − 006 | 0.000E + 000 | −6.736E − 006 | 6.818E − 006 |
| 1.150E − 001 | −1.377E − 006 | 0.000E + 000 | −6.063E − 006 | 6.218E − 006 |
| 1.200E − 001 | −1.550E − 006 | 0.000E + 000 | −5.492E − 006 | 5.706E − 006 |
| 1.250E − 001 | −1.623E − 006 | 0.000E + 000 | −4.999E − 006 | 5.256E − 006 |
| 1.300E − 001 | −1.631E − 006 | 0.000E + 000 | −4.571E − 006 | 4.853E − 006 |
| 1.350E − 001 | −1.596E − 006 | 0.000E + 000 | −4.194E − 006 | 4.487E − 006 |
| 1.400E − 001 | −1.535E − 006 | 0.000E + 000 | −3.860E − 006 | 4.154E − 006 |
| 1.450E − 001 | −1.459E − 006 | 0.000E + 000 | −3.561E − 006 | 3.849E − 006 |
| 1.500E − 001 | −1.375E − 006 | 0.000E + 000 | −3.293E − 006 | 3.569E − 006 |
| 1.550E − 001 | −1.288E − 006 | 0.000E + 000 | −3.052E − 006 | 3.313E − 006 |
| 1.600E − 001 | −1.201E − 006 | 0.000E + 000 | −2.833E − 006 | 3.077E − 006 |
| 1.650E − 001 | −1.217E − 006 | 0.000E + 000 | −2.634E − 006 | 2.861E − 006 |
| 1.700E − 001 | −1.036E − 006 | 0.000E + 000 | −2.453E − 006 | 2.663E − 006 |
| 1.750E − 001 | −9.602E − 007 | 0.000E + 000 | −2.288E − 006 | 2.481E − 006 |
| 1.800E − 001 | −8.888E − 007 | 0.000E + 000 | −2.137E − 006 | 2.314E − 006 |
| 1.850E − 001 | −8.222E − 007 | 0.000E + 000 | −1.998E − 006 | 2.160E − 006 |
| 1.900E − 001 | −7.605E − 007 | 0.000E + 000 | −2,870E − 006 | 2.019E − 006 |
| 1.950E − 001 | −7.035E − 007 | 0.000E + 000 | −1.753E − 006 | 1.889E − 006 |
| 2.000E − 001 | −6.510E − 007 | 0.000E + 000 | −1.645E − 006 | 1.769E − 006 |

In the present application, a separate receiver coil is used although the disadvantage of this is that some way has to be found of decoupling it from the transmitter coils. The classical method of physically orthogonal coils is not available in this case of cylindrical symmetry. Therefore, we use a double receiver coil, made up of coils 9, 10 (FIG. 1) with the two parts connected in series opposition via croaked diodes as shown in FIG. 5. As can be seen in FIG. 5, a conventional receiver coil 9 is connected in a resonant circuit with a variable capacitor 25, the resonant circuit being connected via a matching capacitor 26 to conventional receiving electronics (not shown). In addition, the resonant circuit is connected to a second receiver coil 10 having substantially the same dimensions and number of turns as the receiver coil 9 but electrically connected in opposition and via two pairs of parallel Schottky diodes 27, 28. With this arrangement, at low signal levels (received) no current can flow in the coil 10 and the coil 9 acts as a conventional receiver coil, but at high levels (for example during a transmit sequence) current can flow in the coil 10 and the circuit is essentially non-inductive and so the net coupling to the transmitter coil is almost zero.

Figure 6:
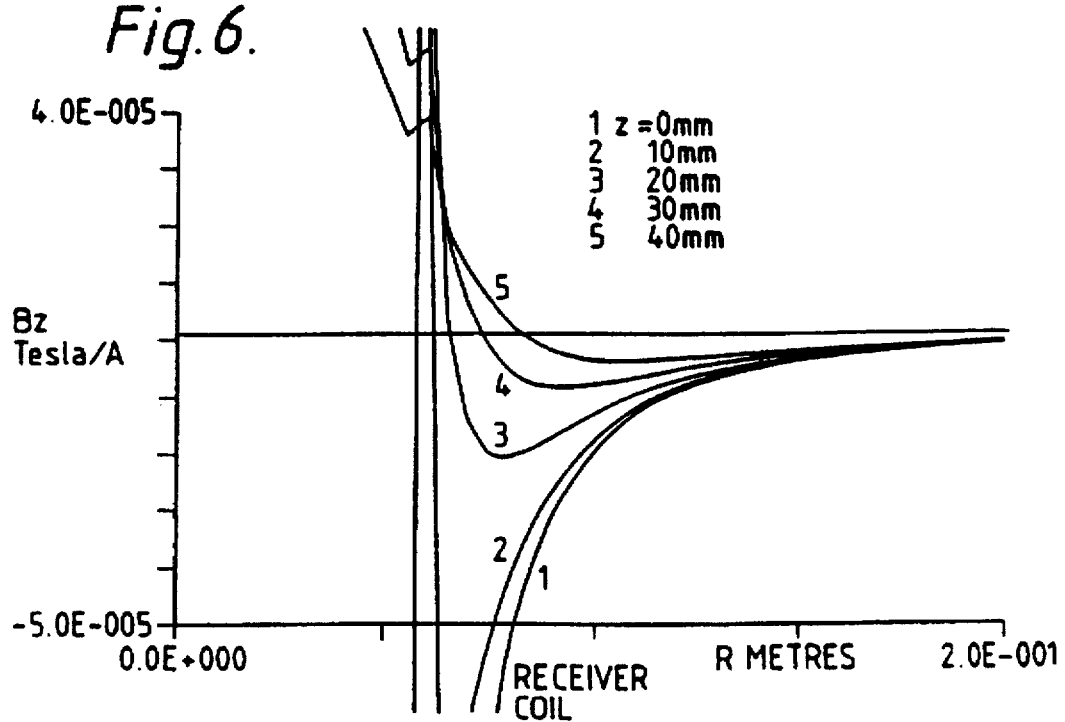
FIG. 6 is a graph which illustrates the variation in field at different axial positions of a receiver coil in accordance with a preferred embodiment of the present invention.

In one example, each coil 9, 10 comprises twelve turns in two layers (six turns per layer), the two coils being interleaved. The conductor would be 2 mm×1 mm rectangular copper wire, with a 3 mm winding pitch and 1 mm interlayer gap. The coil would have an inductance of 27.6 μH requiring about 400 pF to tune. Table 3 below is a typical configuration for one of the coils 9, 10 (with notation as before) and FIG. 6 illustrates graphically the variation in field with radius based on the data set out in Table 3.

TABLE 3

```
Current  2.222E + 005
    a1   5.700E - 002
    a2   6.000E - 002         Z 0.000E + 000
    b1  -9.000E - 003
    b2   9.000E - 003
accuracy 20
```

FIELD PLOTS Tesla Metres Degrees

| R | Br | BΘ | Bz | Bmod |
|---|---|---|---|---|
| Θ = 0.000E + 000 | | | | |
| Z = 0.000E + 000 | | | | |
| 0.000E + 000 | 0.000E + 000 | 0.000E + 000 | 1.274E - 004 | 1.274E - 004 |
| 5.000E - 003 | 0.000E + 000 | 0.000E + 000 | 1.281E - 004 | 1.281E - 004 |
| 1.000E - 002 | 0.000E + 000 | 0.000E + 000 | 1.301E - 004 | 1.301E - 004 |
| 1.500E - 002 | 0.000E + 000 | 0.000E + 000 | 1.338E - 004 | 1.338E - 004 |
| 2.000E - 002 | 0.000E + 000 | 0.000E + 000 | 1.393E - 004 | 1.393E - 004 |
| 2.500E - 002 | 0.000E + 000 | 0.000E + 000 | 1.472E - 004 | 1.472E - 004 |
| 3.000E - 002 | 0.000E + 000 | 0.000E + 000 | 1.585E - 004 | 1.585E - 004 |
| 3.500E - 002 | 0.000E + 000 | 0.000E + 000 | 1.747E - 004 | 1.747E - 004 |
| 4.000E - 002 | 0.000E + 000 | 0.000E + 000 | 1.988E - 004 | 1.988E - 004 |
| 4.500E - 002 | 0.000E + 000 | 0.000E + 000 | 2.365E - 004 | 2.365E - 004 |
| 5.000E - 002 | 0.000E + 000 | 0.000E + 000 | 2.990E - 004 | 2.990E - 004 |
| 5.500E - 002 | 0.000E + 000 | 0.000E + 000 | 4.030E - 004 | 4.030E - 004 |
| 6.000E - 002 | 0.000E + 000 | 0.000E + 000 | -3.202E - 004 | 3.202E - 004 |
| 6.500E - 002 | 0.000E + 000 | 0.000E + 000 | -1.808E - 004 | 1.808E - 004 |
| 7.000E - 002 | 0.000E + 000 | 0.000E + 000 | -1.135E - 004 | 1.135E - 004 |
| 7.500E - 002 | 0.000E + 000 | 0.000E + 000 | -7.627E - 005 | 7.627E - 005 |
| 8.000E - 002 | 0.000E + 000 | 0.000E + 000 | -5.435E - 005 | 5.435E - 005 |
| 8.500E - 002 | 0.000E + 000 | 0.000E + 000 | -4.052E - 005 | 4.052E - 005 |
| 9.000E - 002 | 0.000E + 000 | 0.000E + 000 | -3.126E - 005 | 3.226E - 005 |
| 9.500E - 002 | 0.000E + 000 | 0.000E + 000 | -2.477E - 005 | 2.477E - 005 |
| 1.000E - 001 | 0.000E + 000 | 0.000E + 000 | -2.005E - 005 | 2.005E - 005 |
| 1.050E - 001 | 0.000E + 000 | 0.000E + 000 | -1.651E - 005 | 1.651E - 005 |
| 1.100E - 001 | 0.000E + 000 | 0.000E + 000 | -1.380E - 005 | 1.380E - 005 |
| 1.150E - 001 | 0.000E + 000 | 0.000E + 000 | -1.167E - 005 | 1.167E - 005 |
| 1.200E - 001 | 0.000E + 000 | 0.000E + 000 | -9.976E - 006 | 9.976E - 006 |
| 1.250E - 001 | 0.000E + 000 | 0.000E + 000 | -8.606E - 006 | 8.606E - 006 |
| 1.300E - 001 | 0.000E + 000 | 0.000E + 000 | -7.485E - 006 | 7.485E - 006 |
| 1.350E - 001 | 0.000E + 000 | 0.000E + 000 | -6.556E - 006 | 6.556E - 006 |
| 1.400E - 001 | 0.000E + 000 | 0.000E + 000 | -5.780E - 006 | 5.780E - 006 |
| 1.450E - 001 | 0.000E + 000 | 0.000E + 000 | -5.124E - 006 | 5.124E - 006 |
| 1.500E - 001 | 0.000E + 000 | 0.000E + 000 | -4.567E - 006 | 4.567E - 006 |
| 1.550E - 001 | 0.000E + 000 | 0.000E + 000 | -4.089E - 006 | 4.089E - 006 |
| 1.600E - 001 | 0.000E + 000 | 0.000E + 000 | -3.678E - 006 | 3.678E - 006 |
| 1.650E - 001 | 0.000E + 000 | 0.000E + 000 | -3.322E - 006 | 3.321E - 006 |
| 1.700E - 001 | 0.000E + 000 | 0.000E + 000 | -3.010E - 006 | 3.010E - 006 |
| 1.750E - 001 | 0.000E + 000 | 0.000E + 000 | -2.737E - 006 | 2.737E - 006 |
| 1.800E - 001 | 0.000E + 000 | 0.000E + 000 | -2.496E - 006 | 2.496E - 006 |
| 1.850E - 001 | 0.000E + 000 | 0.000E + 000 | -2.284E - 006 | 2.284E - 006 |
| 1.900E - 001 | 0.000E + 000 | 0.000E + 000 | -2.095E - 006 | 2.095E - 006 |
| 1.950E - 001 | 0.000E + 000 | 0.000E + 000 | -1.927E - 006 | 1.927E - 006 |
| 2.000E - 001 | 0.000E + 000 | 0.000E + 000 | -1.777E - 006 | 1.777E - 006 |

We claim:

1. A nuclear magnetic resonance apparatus comprising:

a magnet assembly which generates a main static magnetic field in a working region external of said magnet assembly, the magnetic field having a uniformity suitable for performing an NMR experiment;

an oscillating electrical source; and an oscillating magnetic field generating assembly having two pairs of axially aligned electrical coils connected to said oscillating electrical source, the electrical coils for generating an oscillating magnetic field within the working region, the axially inner coils being positioned about a mid-point between the axially outer coils, adjacent coils of the electrical coils being wound in opposite senses and connected in series so as to generate opposing magnetic fields which superpose to produce an oscillating magnetic field external to said magnet assembly, the oscillating magnetic field being sufficiently uniform within said working region to perform an NMR experiment and the relative positions of said coils being such that the first order variation of the oscillating magnetic field with distance from the axis is substantially zero within the working volume.

2. A nuclear magnetic resonance apparatus according to claim 1, wherein the electrical coils are connected in a resonant circuit having a current control device which prevents flow of current in said resonant circuit unless the potential difference across said current control device exceeds a threshold.

3. A nuclear magnetic resonance apparatus, according to claim 2, wherein the current control device comprises a pair of diodes connected in parallel and in opposite directions.

4. A nuclear magnetic resonance apparatus according to claim 1, wherein the oscillating magnetic field has a uniformity of at least 25% across said working region.

5. A nuclear magnetic resonance apparatus according to claim 4, wherein said main, static magnetic field has a uniformity of at least 100 ppm across said working region.

6. A nuclear magnetic resonance apparatus according to claim 1, further comprising:

a magnetic field detection assembly having a first electrical coil electrically connected in a resonant circuit, the first electrical coil generates an electrical current in the resonant circuit when subjected to an oscillating magnetic field; and a second electrical coil, connected in parallel and in an opposite sense to said first electrical coil via current control means;

whereby current flow through said first and second electrical coils is in opposite senses, said control means permitting current flow through said second electrical coil when the potential difference across said current control means exceeds a threshold.

7. A nuclear magnetic resonance apparatus according to claim 25, wherein the turns of said first coil are interleaved with turns of said electrical second coil.

8. A nuclear magnetic resonance apparatus according to claim 6, wherein said current control means comprise two pairs of diodes, each pair of diodes being connected in parallel and in opposite senses.

9. A nuclear magnetic resonance apparatus according to claim 6, wherein said first and second electrical coils are substantially coaxial.

10. A nuclear magnetic resonance apparatus according to claim 6, wherein said electrical coils of the generating and detector assemblies are substantially coaxial.

11. A nuclear magnetic resonance apparatus according to claim 10, wherein said electrical coils are substantially coaxial with an elongate axis of said magnet assembly.

* * * * *